United States Patent
Han

(10) Patent No.: US 7,679,183 B2
(45) Date of Patent: Mar. 16, 2010

(54) ELECTRONIC COOLING DEVICE AND FABRICATION METHOD THEREOF

(75) Inventor: Chang Hun Han, Icheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 120 days.

(21) Appl. No.: 12/001,679

(22) Filed: Dec. 11, 2007

(65) Prior Publication Data
US 2008/0149939 A1    Jun. 26, 2008

(30) Foreign Application Priority Data
Dec. 20, 2006  (KR)  ........................ 10-2006-0131297

(51) Int. Cl.
*H01L 23/34* (2006.01)
(52) U.S. Cl. .................... 257/712; 257/467; 438/54; 438/55
(58) Field of Classification Search ............. 257/707, 257/712, 750; 438/181
See application file for complete search history.

(56) References Cited

U.S. PATENT DOCUMENTS

| | | | |
|---|---|---|---|
| 5,188,978 A * | 2/1993 | deSouza et al. ............ 438/181 |
| 6,559,538 B1 * | 5/2003 | Pomerene et al. ........... 257/712 |
| 6,800,933 B1 * | 10/2004 | Mathews et al. ............ 257/712 |
| 7,352,063 B2 * | 4/2008 | Noguchi ..................... 257/707 |

* cited by examiner

*Primary Examiner*—Thanh V Pham
*Assistant Examiner*—Errol Fernandes
(74) *Attorney, Agent, or Firm*—The Law Offices of Andrew D. Fortney; Andrew D. Fortney; William E. Brow

(57) ABSTRACT

Provided are an electronic cooling device and a fabrication method thereof. The method may include forming an insulating layer on a semiconductor substrate, forming first and second silicide layers on the insulating layer, forming separate paired p-type and n-type semiconductors on each of the first and second silicide layers, forming a first interlayer dielectric (ILD) layer on the p-type and n-type semiconductors, exposing top surfaces of the n-type and p-type semiconductors, forming a third silicide layer on one semiconductor on each of the first and second silicide layers, forming a second ILD layer on the third silicide layer, and etching the second and first ILD layers to form contact holes exposing top surfaces of the first and second silicide layers.

16 Claims, 4 Drawing Sheets

ELECTRONIC COOLING DEVICE AND
FABRICATION METHOD THEREOF

CROSS-REFERENCE TO RELATED
APPLICATIONS

The present application claims priority under 35 U.S.C. 119 and 35 U.S.C. 365 to Korean Patent Application No. 10-2006-0131297 (filed on Dec. 20, 2006), which is hereby incorporated by reference in its entirety.

BACKGROUND

The present disclosure relates to an electronic cooling device and a fabrication method thereof.

Integrated circuit (IC) devices such as microprocessors or the like are designed to operate at very high speed. Accordingly, a large amount of heat may be generated in IC devices themselves during operation. As high-speed input/output circuits tend to be applied to the IC devices to meet demands for the high-speed performance of dynamic random access memory (DRAM) devices or central processing units (CPUs), a larger amount of heat may be generated. Therefore, much research has been conducted to reduce the heat generation.

Electrical signals in semiconductors have carriers such as electrons and holes. In general, as a temperature increases, the concentration of carriers may increase rapidly. The increased concentration of carriers according to the temperature serves as a major limitation factor in controlling the operation of devices.

To relieve any thermal limitations of the carriers, a heat sink and/or a fan may be mounted inside an apparatus such as a computer or the like to lower or dissipate the heat generated inside electronic devices.

SUMMARY

Embodiments of the present invention provide an electronic cooling device that can effectively cool down and/or dissipate heat generated in an integrated circuit, and a fabrication method thereof.

In one embodiment, a method of fabricating an electronic cooling device may includes forming an insulating layer on a semiconductor substrate; forming first and second silicide layers on the insulating layer; forming p-type and n-type semiconductors on each of the first and second silicide layers such that the p-type and n-type semiconductors are separated from each other; forming a first dielectric layer on the p-type and n-type semiconductors, and exposing top surfaces of the n-type and p-type semiconductors; forming a third silicide layer on the n-type semiconductor of the first silicide layer and the p-type semiconductor of the second silicide layer; forming a second dielectric layer on the third silicide layer; and etching the second and first dielectric layers to form contact holes exposing top surfaces of the first and second silicide layers.

In another embodiment, an electronic cooling device may include an insulating layer on a semiconductor substrate; first and second conductors on the insulating layer; a plurality of paired p-type and n-type semiconductor bodies on each of the first and second conductors; a first dielectric layer between the p-type and n-type semiconductor bodies; a third conductor connecting the n-type semiconductor of the first conductor and the p-type semiconductor of the second conductor; a second dielectric layer on the third conductor; and contact holes penetrating the first and second interlayer layers to expose top surfaces of the first and second conductors.

The details of one or more embodiments are set forth in the accompanying drawings and the description below. Other features will be apparent from the description and drawings, and from the claims.

DETAILED DESCRIPTION OF THE
EMBODIMENTS

An electronic cooling device and a fabrication method thereof according to various embodiments of the invention will be more fully described with reference to the accompanying drawings.

Figure 9:
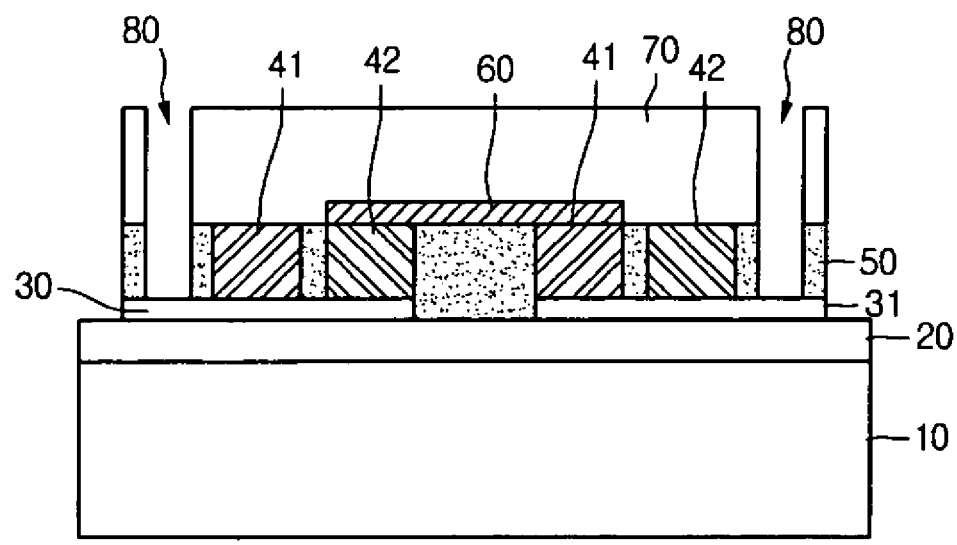

FIG. 9 is a sectional view of an electronic cooling device according to an embodiment. The electronic cooling device according to the embodiment is configured with a plurality of p-type semiconductor bodies and a plurality of n-type semiconductor bodies connected in series, using the Peltier effect.

Referring to FIG. 9, an insulating layer 20 is provided on a semiconductor substrate 10. For instance, the insulating layer 20 may include an aluminum oxide layer. Particularly, the insulating layer 20 may have a thickness in the range of 10 μm to 300 μm. A target thickness of the insulating layer 20 may consider the amount of heat generated in a device employing the exemplary cooling device. As the amount of generated heat becomes larger, the insulating layer 20 may have a greater thickness.

First and second conductors (e.g., silicide layers) 30 and 31 are disposed on the insulating layer 20 such that they are separated from each other.

A p-type semiconductor body 41 and an n-type semiconductor body 42 are provided on each of the first and second silicide layers 30 and 31. Complementary semiconductor bodies 41 and 42 are generally paired (i.e., one of each type) on the conductors 30 and 31. As a result, the arrangement of semiconductor bodies 41 and 42 on the conductors 30 and 31 may be reversed (e.g., p-type semiconductor body 41 may be on the end of first silicide layer 30 closest to second silicide layer 31, and n-type semiconductor body 42 may be outside of p-type semiconductor body 41).

The p-type semiconductor 41 may be obtained by implanting p-type impurity ions into a semiconductor layer, such as amorphous or polycrystalline silicon. Likewise, the n-type semiconductor 42 may be obtained by implanting n-type impurity ions into the semiconductor layer.

The p-type and n-type semiconductors 41 and 42 on the first silicide layer 30 are separated from the p-type and n-type semiconductors 41 and 42 on the second silicide layer 31 by a first interlayer dielectric (ILD) layer 50. For example, the first ILD layer 50 may include an oxide (e.g., silicon dioxide) layer.

A third conductor (e.g., silicide layer) 60 is provided on top surfaces of the n-type semiconductor 42 on the first silicide layer 30 and the p-type semiconductor 41 on the second silicide layer 31. Therefore, the n-type semiconductor 42 on the first silicide layer 30 and the p-type semiconductor 41 on the second silicide layer 31 are electrically connected to each other in series, preferably by the third conductor 60.

A second ILD layer 70 is provided on the third silicide layer 60. For example, the second ILD layer 70 may include an oxide (e.g., silicon dioxide) layer. A contact hole 80 is provided in the first and second ILD layers 50 and 70 by etching the second and first ILD layers 70 and 50 at a predetermined location and/or in a predetermined shape. That is, the contact hole 80 exposes an edge or outer portion of each of the first and second silicide layers 30 and 31. Here, the contact hole 80 may be singular or plural.

The electronic cooling device having the above configuration makes use of the Peltier effect, and can exhibit an excellent cooling effect even in a small-sized electronic device by controlling the magnitude and duration of current supplied to the electronic cooling device.

As for the Peltier effect in brief, electrons near Fermi level of a metal must move into a conduction band of a semiconductor when the electrons flow into the semiconductor from the metal. Therefore, when the conductive electrons move from the metal to the semiconductor, their average kinetic energy must increase. The additional kinetic energy is manifested by absorption of heat. That is, the absorbed heat or thermal energy increases the average kinetic energy of electrons. Provided that a larger amount of current flows, the kinetic energies of the electrons decrease, which results in generating heat. Therefore, since the average kinetic energy of the electrons is changed when the electrons pass through a junction region, it can be understood that heat may be absorbed or generated depending on current direction.

This reversible Peltier effect occurs whenever current flows. The electronic cooling device is a semiconductor device using the Peltier effect. In detail, when two different kinds of conductors or charge carriers (e.g., the p-type semiconductor 41 and the n-type semiconductor 42) are joined to each other (e.g., electrically or capacitively) and current is then applied thereto, a predetermined amount of heat is generated or absorbed in proportion to the current of the junction region(s) formed by such joining. When the current flows in an opposite direction, the heat generation or heat absorption occurs in reverse. Such an electronic cooling device is advantageous in that it can be miniaturized, it can cool down an integrated circuit at once when power is supplied, and it can cool and generate heat by attaching a switch for simple polarity conversion.

CMOS image sensors are semiconductor devices that convert an optical image into electrical signals. CMOS image sensors generate such electrical signals from charges (electron-hole pairs) created or generated in a photodiode formed in the semiconductor substrate or an epitaxial semiconductor layer formed thereon. The more heat in a CMOS image sensor, the more noise there is in the electrical signals generated in the image sensor. The effects of heat generated in the CMOS image sensor device are unusually large, given the known effects of heat in integrated circuits such as microprocessors and DRAMs.

Figure 10:
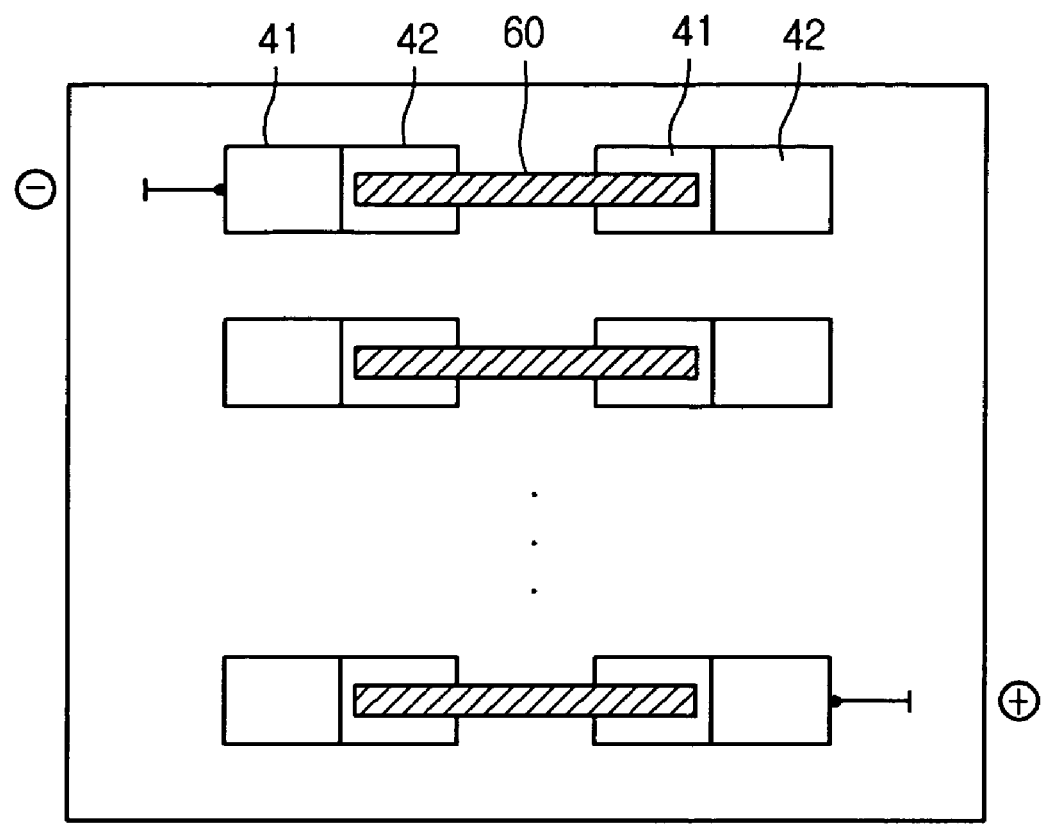
FIG. 10 is a layout view of an exemplary electronic cooling device according to embodiments of the invention.

FIG. 10 is a view of a layout for the exemplary electronic cooling device of FIG. 9. The cooling structure including the first and second conductors (not shown), first and second pairs of semiconductor bodies 41 and 42 respectively thereon, and third conductor 60 electrically connecting an n-type semiconductor body 42 to a p-type semiconductor body 41 are shown as extending across the cooling device or integrated circuit, along one dimension (e.g., the length or width) of the cooling device or integrated circuit. A plurality of such cooling structures are shown in parallel along the other (orthogonal) dimension of the cooling device or integrated circuit. A contact hole to a pad (e.g., the exposed edge or outer portion of each of the first and second conductors) is schematically shown in or near corners of the cooling device or integrated circuit. Generally, a positive bias is applied to the exposed edge or outer portion of the conductor having an n-type semiconductor body 42 closest thereto, and a negative bias or ground potential is applied to the exposed edge or outer portion of the conductor having a p-type semiconductor body 41 closest thereto.

FIGS. 1 to 9 are sectional views illustrating a method of fabricating an electronic cooling device according to embodiments of the invention.

Figure 1:
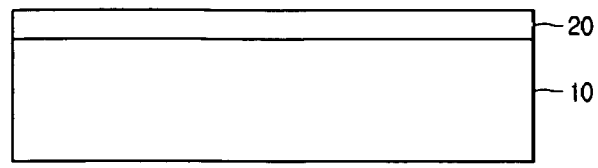
FIGS. 1 to 9 are sectional views illustrating an exemplary method of fabricating an electronic cooling device according to embodiments of the invention.

Referring to FIG. 1, an insulating layer 20 is formed on a semiconductor substrate 10. For example, the insulating layer 20 may comprise or be formed of aluminum oxide, and may have a thickness in the range of 10 μm to 300 μm. Particularly, in consideration of the amount of heat generated in a device such as an image sensor or the like, the insulating layer 20 may be thicker as the amount of generated heat becomes greater.

A polysilicon layer (not shown) is formed on the insulating layer 20, and the polysilicon layer is patterned into a predetermined shape using a photolithography process to thereby form polysilicon patterns (not shown) that are separated from each other.

Figure 2:
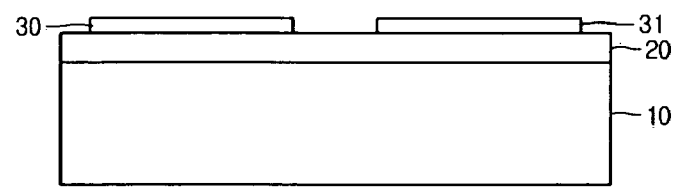

Referring to FIG. 2, a metal layer is deposited on the polysilicon patterns, then annealed to form first and second silicide layers 30 and 31 that can reduce contact resistance. Unreacted metal (i.e., not converted into metal silicide) may be removed by selective etching, as is known in the art. Of course, any conductive material (or combination of conductive materials, which may be laminated or stacked) may be used instead of a metal silicide.

Figure 3:
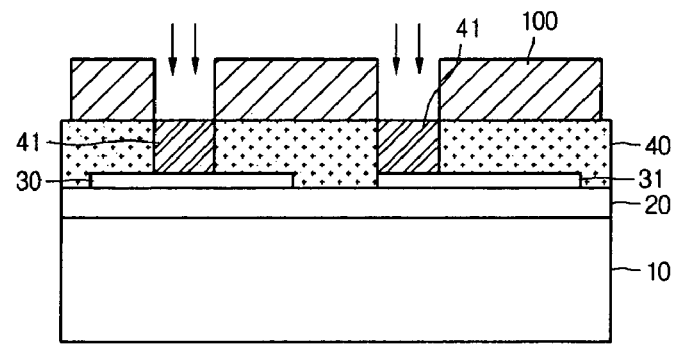

Referring to FIG. 3, another polysilicon layer 40 is formed to a predetermined thickness on the first and second silicide layers 30 and 31, and the exposed insulating layer 20. For example, the polysilicon layer 40 is formed using impurity-free polysilicon or n-type or p-type impurity-doped polysilicon.

When the polysilicon layer 40 comprises n-type doped polycrystalline silicon, p-type impurities may be implanted into only the regions where a p-type semiconductor will be formed. Alternatively, when the polysilicon layer 40 comprises p-type doped polysilicon, n-type impurities may be implanted into only the regions where an n-type semiconductor will be formed.

Figure 4:
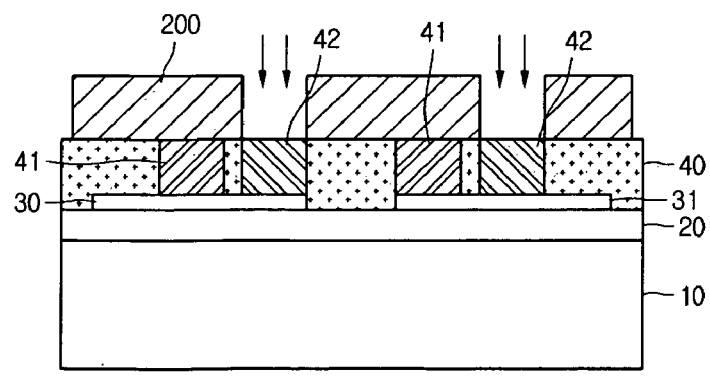

Alternatively, when the polysilicon layer 40 uses impurity-free polysilicon, p-type impurities and n-type impurities may be respectively implanted into the polysilicon layer 40 to form a p-type semiconductor 41 and an n-type semiconductor 42, as shown in FIGS. 3 and 4. Specifically, a photoresist layer is formed on the polysilicon layer 40, and photoexposure and development processes are then performed to form a first photoresist pattern 100 that selectively exposes a region where a p-type semiconductor will be formed, as shown in FIG. 3. P-type impurity ions are then implanted into the polysilicon layer 40 using the first photoresist pattern 100 as an ion implantation mask to form p-type semiconductor regions 41 on the first and second silicide layers 30 and 31, respectively.

Referring to FIG. 4, the first photoresist pattern 100 is removed. Thereafter, another photoresist layer is formed on the polysilicon layer 40, and then photoexposure and development processes are performed to form a second photoresist pattern 200 that selectively exposes regions where an n-type semiconductor will be formed.

Afterwards, n-type impurity ions are implanted into the polysilicon layer 40 using the second photoresist pattern 200 as an ion implantation mask to form n-type semiconductor regions 42 on the first and second silicide layers 30 and 31, respectively. After removing the second photoresist pattern 200, a pair of the p-type and n-type semiconductors 41 and 42 are formed on each of the first and second silicide layers 30 and 31.

Figure 5:
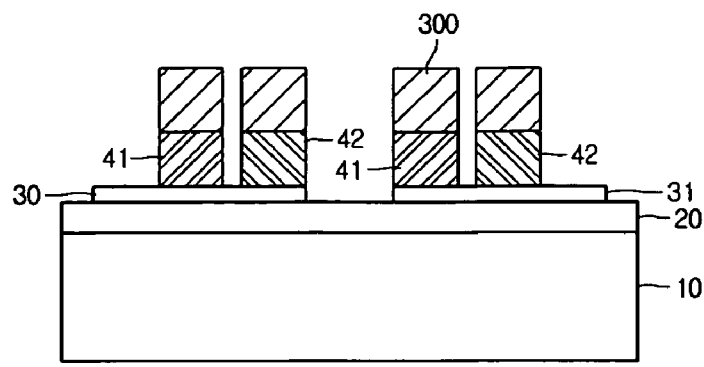

Referring to FIG. 5, still another photoresist layer is formed on the polysilicon layer 40, and a photolithography process is performed to form a third photoresist pattern 300 exposing the regions other than the p-type and n-type semiconductors 41 and 42. An etching process is performed using the third photoresist pattern 300 as an etch mask to remove the portions of the polysilicon layer 40 between the p-type and n-type semiconductors 41 and 42.

Figure 6:
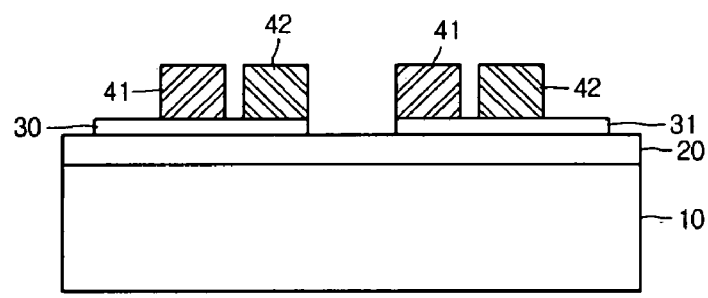

Referring to FIG. 6, the third photoresist pattern 300 is removed. As a result of the etching step, the p-type and n-type semiconductor 41 and 42 on the first and second silicide layers 30 and 31 are all separate from one another.

Figure 7:
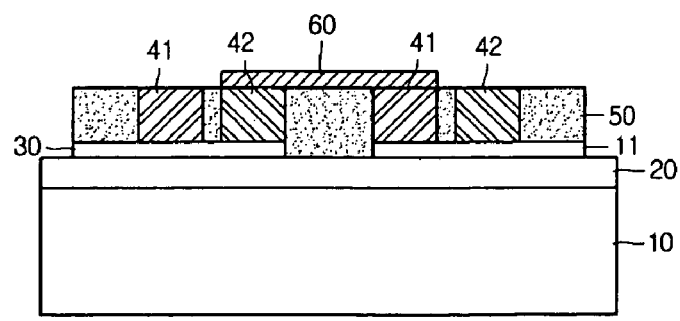

Referring to FIG. 7, a first ILD layer 50 is formed on the resultant structure including the p-type and n-type semiconductors 41 and 42. Generally, first ILD layer 50 is formed by chemical vapor deposition (CVD), which may be plasma enhanced (PECVD), assisted by high density plasma (HDP-CVD), low pressure (LP), or atmospheric pressure (AP). Afterwards, the first ILD layer 50 is planarized using blanket etching (e.g., etch back) or chemical mechanical polishing (CMP) such that top surfaces of the p-type and n-type semiconductor bodies 41 and 42 are exposed. Preferably, the uppermost (top) surfaces of the first ILD layer 50 are substantially coplanar with the uppermost surfaces of the semiconductor bodies 41 and 42.

Thereafter, a polysilicon layer (not shown) is deposited on the p-type semiconductor 41, the n-type semiconductor 42 and the first ILD layer 50. A photoresist layer (not shown) is formed on the polysilicon layer, and the photoresist layer is patterned using a photolithography process to form a photoresist pattern (not shown). Subsequently, the polysilicon layer is etched using the photoresist pattern as an etch mask to thereby form a polysilicon pattern on the n-type semiconductor 42 on the first silicide layer 30 and the p-type semiconductor 41 on the second silicide layer 31. Afterwards, a metal layer is deposited on the polysilicon pattern to form a third silicide layer 60 that can reduce contact resistance. The third silicide layer 60 connects the n-type semiconductor 42 on the first silicide layer 30 to the p-type semiconductor 41 on the second silicide layer 31 in series. As for the first and second silicide layers 30 and 31, the third silicide layer 60 may be replaced with a third conductor, comprising any conductive material (or combination of conductive materials, which may be laminated or stacked).

Figure 8:
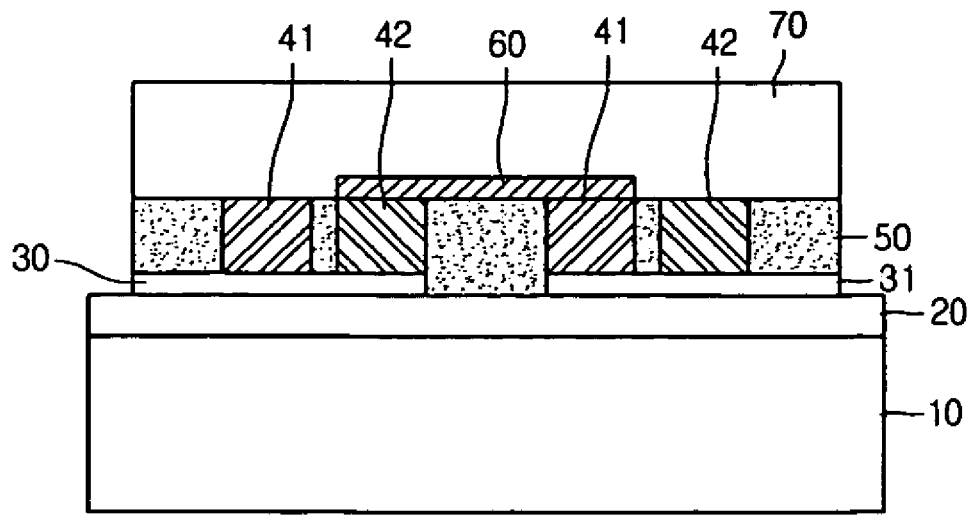

Referring to FIG. 8, a second ILD layer 70 is formed on the resultant structure including the third silicide layer 60, and then a planarization process is performed (generally by CMP). For instance, the second ILD layer 70 may comprise or be formed of an oxide (e.g., $SiO_2$).

Referring to FIG. 9, edge or outer portions of the first and second ILD layers 50 and 70, which are stacked over the semiconductor substrate 10, are etched away to form contact holes 80. For example, the contact holes 80 may be formed in such a way that a photoresist pattern is formed on the second ILD layer 70 and an etching process is then performed.

The contact holes 80 for applying an external voltage are formed such that surfaces of the first and second silicide layers 30 and 31 are exposed, thereby completing the electronic cooling device. The contact holes 80 may then be filled with a conductive material (e.g., a metal, such as aluminum, tungsten or copper).

Pursuant to the electronic cooling device and the fabrication method thereof according to embodiments of the invention, it is possible to fabricate a semiconductor electronic cooling device using the Peltier effect. In one embodiment, the present cooling device is made separately from the integrated circuit or image sensor (e.g., using relatively low-resolution photolithography and processing equipment, such as that used for devices having critical dimensions of 1 μm, 2 μm, 5 μm, or 10 μm, etc.). Thereafter, the integrated circuit or image sensor is mounted on or bonded to the cooling device by essentially any die-to-die bonding technology. In one embodiment, the surfaces of the integrated circuit or image sensor and the cooling device to be bonded together are plasma treated (e.g., to clean the surfaces and/or increase the average surface roughness), then the integrated circuit or image sensor is bonded to the cooling device using a thermally conductive adhesive.

In addition, the electronic cooling device and the fabrication method thereof according to the embodiment can be applied to a semiconductor integrated device so that heat generated inside an integrated circuit can be dissipated or cooled down, and particularly an image sensor can operate at high temperature, more efficiently during extended periods of use, and/or with less thermally-induced noise.

Furthermore, dark current such as photoelectric current caused by photoelectric conversion can be effectively controlled, and thus higher amplification is possible for realizing a sharp image. Therefore, it is possible to improve quality of a complementary metal-oxide-semiconductor (CMOS) image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a device, comprising:
   forming a pair of p-type semiconductor bodies and a pair of n-type semiconductor bodies on each of first and second silicide patterns such that the p-type semiconductor bodies of the pair of p-type semiconductor bodies are separated from each other and the n-type semiconductor bodies of the pair of n-type semiconductor bodies are separated from each other;
   forming a first dielectric layer on the p-type and n-type semiconductor bodies, and exposing top surfaces of the n-type and p-type semiconductor bodies;

forming a third silicide layer on a first one of the n-type semiconductor bodies on the first silicide layer and on a first one of the p-type semiconductor bodies on the second silicide layer;

forming a second dielectric layer on the third silicide layer and on an uppermost surface of a second one of the p-type semiconductor bodies and a second one of the n-type semiconductor bodies; and etching the second and first dielectric layers to form a contact hole exposing top surfaces of the first and second silicide layers.

2. The method according to claim 1, further comprising, prior to forming the p-type and n-type semiconductor bodies, forming an insulating layer on a semiconductor substrate, then forming the first and second silicide layers on the insulating layer.

3. The method according to claim 1, wherein forming the p-type and n-type semiconductor bodies comprises:

forming a polysilicon layer on the first and second silicide layers; and implanting impurities into the polysilicon layer.

4. The method according to claim 2, wherein the insulating layer comprises an aluminum oxide layer.

5. The method according to claim 2, wherein the insulating layer has a thickness in the range of from 10 μm to 300 μm.

6. The method according to claim 3, wherein the polysilicon layer comprises n-type doped polysilicon, and forming the p-type semiconductor bodies comprises implanting p-type impurities into predetermined regions of the n-type doped polysilicon.

7. The method according to claim 3, wherein the polysilicon layer comprises p-type doped polysilicon, and forming the n-type semiconductor bodies comprises implanting n-type impurities into predetermined regions of the p-type doped polysilicon.

8. The method according to claim 1, wherein each of the first and second dielectric layers comprises an oxide.

9. An electronic cooling device, comprising:

an insulating layer on a semiconductor substrate;

first and second silicide layers on the insulating layer;

a pair of p-type semiconductor bodies on the first and second silicide layers;

a pair of n-type semiconductor bodies on the first and second silicide layers, where the p-type semiconductor bodies of the pair of p-type semiconductor bodies are separated from each other and the n-type semiconductor bodies of the pair of n-type semiconductor bodies are separated from each other;

a first dielectric layer between the p-type and n-type semiconductor bodies;

a third silicide layer on a first one of the n-type semiconductor bodies on the first silicide layer and a first one of the p-type semiconductor bodies on the second silicide layer so as to connect the first one of the n-type semiconductor bodies on the first silicide layer to the first one of the p-type semiconductor bodies on the second silicide layer;

a second dielectric layer on the third silicide layer and on an uppermost surface of a second one of the p-type semiconductor bodies and a second one of the n-type semiconductor bodies; and contact holes penetrating the first and second dielectric layers to expose top surfaces of the first and second silicide layers.

10. The electronic cooling device according to claim 9, wherein the insulating layer comprises an aluminum oxide layer.

11. The electronic cooling device according to claim 9, wherein the insulating layer has a thickness in the range of from 10 μm to 300 μm.

12. The electronic cooling device according to claim 9, wherein the p-type semiconductor body comprises a p-type impurity.

13. The electronic cooling device according to claim 9, wherein the n-type semiconductor body comprises an n-type impurity.

14. The electronic cooling device according to claim 10, wherein each of the contact holes are singular or plural.

15. The electronic cooling device according to claim 9, wherein each of the first and second dielectric layers comprises an oxide layer.

16. A cooled image sensor, comprising:

a CMOS image sensor; and the electronic cooling device according to claim 9.

* * * * *